United States Patent [19]

Hikita

[11] Patent Number: 4,468,642
[45] Date of Patent: Aug. 28, 1984

[54] BAND PASS FILTER DEVICE

[75] Inventor: Mitsutaka Hikita, Hachioji, Japan

[73] Assignee: Hitachi, Ltd., Tokyo, Japan

[21] Appl. No.: 386,068

[22] Filed: Jun. 7, 1982

[30] Foreign Application Priority Data

Jun. 5, 1981 [JP] Japan .................................. 56-85720

[51] Int. Cl.³ ....................... H03H 9/64; H03H 9/145
[52] U.S. Cl. ................................ 333/193; 310/313 D; 333/194; 333/195; 333/196
[58] Field of Search ................................. 333/150–155, 333/193–196; 310/313 R, 313 A, 313 B, 313 C, 313 D

[56] References Cited

U.S. PATENT DOCUMENTS

| 3,859,608 | 1/1975 | Hartmann et al. | 333/195 |
| 4,044,321 | 8/1977 | Vasile | 310/313 C |
| 4,063,202 | 12/1977 | Vasile | 333/195 X |
| 4,143,343 | 3/1979 | Inoue et al. | 333/194 |
| 4,298,849 | 11/1981 | Arneson | 333/193 |

Primary Examiner—Marvin L. Nussbaum
Attorney, Agent, or Firm—Antonelli, Terry & Wands

[57] ABSTRACT

A band pass filter device has transducers comprised of thin metal stripes or slits formed on a surface of a piezoelectric plate for propagation of acoustic waves. The device comprises first and second band pass filters at least one of which is made unidirectional. The first band pass filter includes a first acousto-electric transducer and electro-acoustic transducers disposed on opposite sides of the first acousto-electric transducer and connected in common to an input signal source, and the second band pass filter includes a second electro-acoustic transducer connected electrically to the first acousto-electric and second acousto-electric transducers disposed on opposite sides of the second electro-acoustic transducer and connected in common to an output terminal, whereby a frequency characteristic can be obtained wherein loss is reduced in a pass band and increased in a stop band, and rising at the boundary between the pass band and stop band is made sharp. The small-sized band pass filter device having the above frequency characteristic is used for communication apparatus at VHF or UHF.

12 Claims, 6 Drawing Figures

BAND PASS FILTER DEVICE

BACKGROUND OF THE INVENTION

This invention relates to a band pass filter device and more particularly to a band pass filter device of the type having a plurality of thin metal stripes or slits formed on a surface of a plate made of a piezoelectric material or non-piezoelectric material for propagation of acoustic waves and operable in a frequency range of VHF or UHF.

A circuit device utilizing elastic surface waves such as a resonator or filter circuit device has been developed as a circuit used in the VHF or UHF frequency range in place of a conventional circuit utilizing a combination of concentrated circuit elements such as capacitance, resistance and inductance elements. This circuit has already been applied to a communication apparatus and a television receiver set. The surface wave circuit device has many advantages such as easy miniaturization, stable operating characteristic and realization of uniform characteristics at low cost but still has unsolved problems. Particularly, minimization of loss and attainment of desired frequency characteristic have not yet been reached.

In recent years, it has been desired to make a filter device, applicable to various communication apparatus and home appliances, which has a characteristic wherein loss is reduced in a pass band, attenuation is large in a stop band and rising at the boundary between the pass band and stop band is sharp. In other words, a square-wave-like frequency characteristic in the pass band is desired.

Various types of surface wave filter devices have hitherto been proposed to satisfy the above requirements, but existing filter devices are unsatisfactory to meet all of the requirements. U.S. Pat. No. 4,044,321 entitled "Surface acoustic wave band pass filtering" discloses a surface wave band pass filter device, similar to a filter device of the present invention, which can reduce spurious component due to bulk wave and produce large attenuation in a stop band.

The band pass filter device according to the U.S. Pat. No. 4,044,321 comprises two surface wave filters connected electrically in series having the same frequency characteristic $f(\omega)$ for surface waves but different frequency characteristics for bulk waves, whereby the total frequency characteristic is such that $\{f(\omega)\}^2$ is maintained in the pass band and an attenuation beyond $\{f(\omega)\}^2$ is obtained in the stop band.

However, the inventors of this application have found the above band pass filter device defective in that loss in the pass band is large and the frequency characteristic in the pass band is uneven while containing ripple.

SUMMARY OF THE INVENTION

An object of this invention is to provide a band pass filter device based on surface waves capable of having such a characteristic that loss is minimized and frequency characteristic is even in a pass band, attenuation is large in a stop band, and rising is abrupt at the boundary between the pass band and stop band.

According to this invention, to accomplish the above object, a band pass filter device comprises two surface wave band pass filters connected electrically in series. Specifically, the invention comprises: one surface wave band pass filter including a first acousto-electric transducer, and first electro-acoustic transducers (input transducers) disposed on opposite sides of the first acousto-electric transducer and connected in common to an electric signal source (input signal); and the other surface wave band pass filter including a second electro-acoustic transducer connected electrically to the first acousto-electric transducer (in image impedance connection), and second acousto-electric transducers (output transducers) disposed symmetrically with the second electro-acoustic transducer on opposite sides thereof and connected electrically in common to an output terminal.

Individual input and output transducers are made unidirectional by multi-strip couplers or reflectors surrounding them so that surface acoustic waves propagating outwards can effectively be returned toward the first acousto-electric transducer or the second electro-acoustic transducer.

The two surface wave band pass filters have patterns which are symmetrical with a line (image impedance connection) but it is not necessary that this patterning be strictly symmetrical. Further, each of the first acousto-electric transducer and second electro-acoustic transducer being in image impedance connection is of a unitary construction in one embodiment while in another embodiment it is divided into a plurality of transducers arranged in the propagation direction of acoustic waves.

The band pass filter device according to the invention can advantageously provide a characteristic wherein the boundary between the pass band and stop band rises sharply and loss is minimized to make the frequency characteristic even, while taking advantage of small-sized acoustic wave transducers.

DESCRIPTION OF PREFERRED EMBODIMENTS

The invention will now be described with reference to the drawings.

Figure 1:
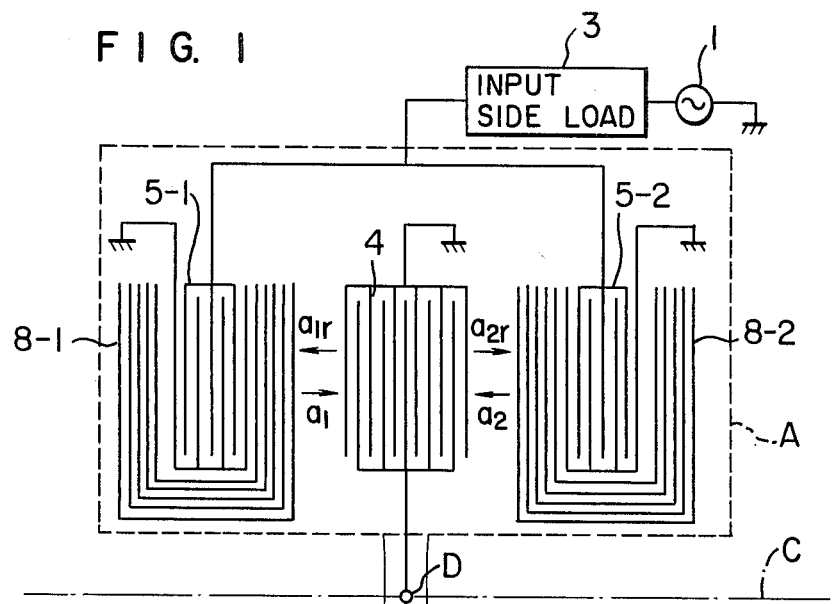
FIG. 1 illustrates one embodiment of a band pass filter device according to the invention.

Referring to FIG. 1, a band pass filter device embodying the present invention comprises two surface acoustic wave band pass filters A and B which are symmetrical with line C. Each of the filters A and B has a plate (not shown) of, for example, lithium niobate LiNbO$_3$ which is capable of propagating surface waves and on which a pattern of thin metal stripes are formed by technique of metal evaporation as shown in FIG. 1. The stripes drawn with geometrical lines for simplicity of illustration actually have a predetermined width.

The surface wave band pass filter A includes a first acousto-electric transducer 4, first electro-acoustic transducers 5-1 and 5-2 disposed symmetrically with respect to the transducer 4 on both sides thereof, and multi-strip couplers 8-1 and 8-2 respectively surrounding the transducers 5-1 and 5-2 to provide them with a unidirectional characteristic whereby acoustic waves resulting from electro-acoustic conversion at the transducers 5-1 and 5-2 are allowed to propagate only toward the transducer 4. One electrode of each of the transducers 5-1 and 5-2 is electrically connected to a signal source 1 via a common input side load 3.

The thin metal stripes of the surface wave band pass filters A and B are arranged as if they were foldable along the chained line C, and hence they are in an image impedance connection, having an identical impedance as viewed from a connecting point D.

A transducer 6, serving as a second electro-acoustic transducer for conversion of an output electric signal of the transducer 4 into an acoustic signal, produces the acoustic signal which is converted into an electric signal by second acousto-electric transducers 7-1 and 7-2. The converted electric signal is applied, as an output signal of the band pass filter device, to an output side load 2.

To describe briefly an individual transducer and multi-strip coupler per se known in the art, the transducer comprises two sets of interdigital conductors each having parallel fingers in the form of thin stripes connected, at one end, in common. The number of fingers of the interdigital conductor determines frequency band, and the period of arrangement of the parallel thin stripes determines a center frequency of pass band and it is set to be equal to a wavelength of the center frequency signal. The spacing between adjacent thin stripes of the multi-strip coupler is set to be $\frac{1}{4}$ or less of the wavelength.

The number of thin stripes of the multi-strip coupler is so set as to establish a 3dB coupler. Each of the multi-strip couplers 8-1 and 8-2 is curved into a U-shape and the transducer is disposed in the U-shaped cup in an off-centered relationship with the coupler by $\frac{1}{8}$ wavelength to ensure that surface acoustic waves propagate in a direction opposite to the transducer 4 can be returned toward the transducer 4, thereby attaining unidirectional propagation of the waves.

In operation, the transducers 5-1 and 5-2 convert input electric signals into acoustic signals which excite the substrate. By the action of the multi-strip couplers 8-1 and 8-2, all of surface acoustic waves $a_1$ and $a_2$ are caused to propagate toward the transducer 4. Since the transducers 5-1 and 5-2 are symmetrical with the transducer 4, the surface acoustic waves $a_1$ and $a_2$ have identical amplitude and phase. In a pass band (frequency band in which the image impedance of the transducers 4 and 6 as viewed from the connecting point D is a pure resistance) of the filter, the surface acoustic waves $a_1$ and $a_2$ are converted into electric signals, and all the electric signals entering the second electro-acoustic transducer 6 are again converted into surface acoustic waves $b_1$ and $b_2$ which propagate along the plate surface laterally. The surface acoustic waves $b_1$ and $b_2$ are then converted into electric signals at the second acousto-electric transducers 7-1 and 7-2 and delivered to the output side load as a filter output. Like the multi-strip couplers 8-1 and 8-2, multi-strip couplers 9-1 and 9-2 are configured to establish a unidirectional transducer wherein the surface acoustic waves $b_1$ and $b_2$ are prevented from leakage to the outside by the aid of the couplers 9-1 and 9-2 and converted into electric signals at the transducers 7-1 and 7-2. Accordingly, when letting amplitudes of the surface waves $a_1$, $a_2$, $b_1$ and $b_2$ be $|a_{1p}|$, $|a_{2p}|$, $|b_{1p}|$ and $|b_{2p}|$, $|a_{1p}| = |a_{2p}| \simeq |b_{1p}| = |b_{2p}|$ is held within the aforementioned pass band.

In a stop band, on the other hand, the majority of surface waves $a_1$ and $a_2$ are reflected at the transducer 4 and reflecting waves $a_{1r}$ and $a_{2r}$ are returned to the transducers 5-1 and 5-2 and reconverted thereby into electric signals which are absorbed by the input side load. Consequently, amplitudes of the surface waves $b_1$ and $b_2$ emitted from the transducer 6 are minimized to provide the filter with a stop-band characteristic.

Figure 2:
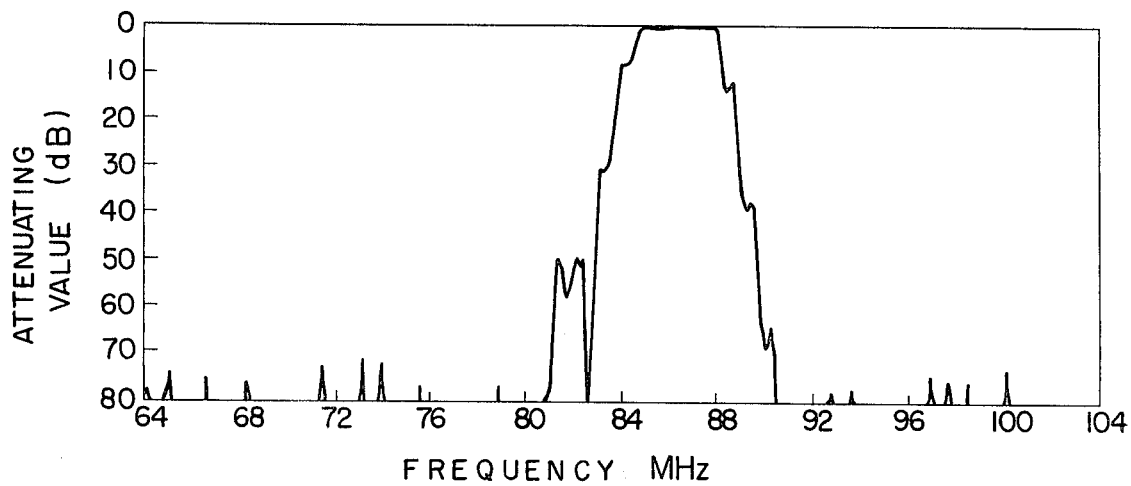
FIG. 2 is a graph showing a frequency characteristic of the FIG. 1 embodiment.
Figure 3:
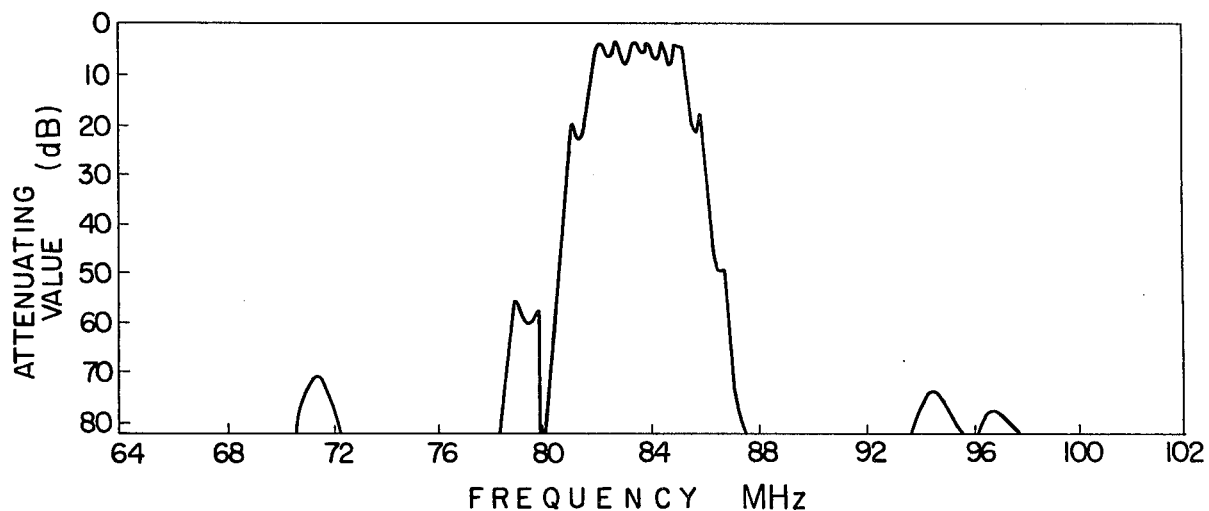
FIG. 3 is a graph showing a frequency characteristic as obtained with a device similar to the FIG. 1 device without multi-strip couplers.

FIG. 2 illustrates a frequency characteristic of the band pass filter device in accordance with the foregoing embodiment, where the abscissa represents frequency and ordinate represents attenuating value. To highlight effects of the present invention, there is shown in FIG. 3 a frequency characteristic of a band pass filter device which is identical with the FIG. 1 band pass filter device except that the multi-strip couplers 8-1, 8-2, 9-1 and 9-2 are removed and the center frequency is different. The characteristic of FIG. 2 evidences drastic attenuation in the stop band and an abrupt rise at the boundary between the pass band and the stop band. Without the multi-strip couplers, as shown in FIG. 3, the attenuation in the stop band is large but even in the pass band (82 to 85 MHz), an attenuation of 5 to 12 dB occurs, leading to the uneven, fluctuating frequency characteristic which deleteriously impairs filtering function.

On the contrary, with the band pass filter device of the invention, as shown in FIG. 2, the loss (attenuation) in the pass band (84 to 88 MHz) is negligibly small and even frequency characteristic, without ripple, is obtained which is improved remarkably as compared to the FIG. 3 characteristic. This accounts for the fact that the multi-strip couplers make the transducers unidirectional in order for energy leakage and consequent ripple to be minimized.

Structurally, the first and second surface wave band pass filters A and B in the foregoing embodiment are symmetrical with the line C and electrically, impedances of the transducers 4 and 6 as viewed from the connecting point to both these transducers are made equal to each other, thus exhibiting image impedances.

Accordingly, when the image impedance is a pure resistance, the output electric signals of the transducer 4 is applied to the transducer 6 without reflection. However, when the image impedance contains a reactance component, a reactance component of the transducer 4 is added to a reactance component of the transducer 6 to double the affect on the reflection, resulting a large reflection. It will be seen from the above that the transducers being in an image impedance connection are required to have image impedances which are of pure resistance for the pass-band frequency. To this end, the transducers may be arranged as will be explained below.

Generally, the transducer is capacitive because of its inter-electrode electrostatic capacitances. However, experiments and theoretical calculations have lead to the following results. More particularly, when letting the number of pairs of electrodes included in the transducer be N and the electro-mechanical coupling constant of a piezoelectric substrate in use be $k^2$, $k^2 = 2(v_f - v_m)/v_f$, where $v_f$ represents a velocity of the surface acoustic wave propagating along a free surface and $v_m$ a velocity of the surface acoustic wave propagating along a surface coated with a metal thin film, a transducer having a pair number of $N \simeq 1.5/k^2$ exhibits an impedance of substantial pure resistance due to the fact that a dynamic reactance acruing from vibration in the pass band of the filter device (reactance acruing from reaction attendant on the vibration) cancels out the inter-electrode capacitances. Accordingly, when transducers 4 and 6 in image impedance connection having each a pair number of $N \simeq 1.5/k^2$ are used, current flows from the upper transducer 4 to the lower transducer 6 without reflection in the pass band of the filter device but undergoes great reflection in the stop band, thereby attaining great attenuation in the stop band. As experiments and theoretical calculations prove, the shifting of capacitive impedance to pure resistance through a narrow frequency range, so the change of pass band to stop band of the filter device takes place through a narrow frequency range, provides the characteristic of a sharply defined pass band characteristic.

Transducers having a pair number of $N < 1.5/k^2$ are sometimes used with a piezoelectric plate of a small electro-mechanical coupling constant $k^2$ or for a filter device of a relatively wide band. In this case, impedances of the transducers being in image impedance connection contain capacitive components with the result that current flowing from the upper transducer to the lower transducer undergoes great reflection even in the pass band of the filter device. In order to eliminate this reflection, an inductance (coil) which cancels out the capacitive component of impedance in the pass band of the filter device is connected in parallel or series with the image impedance connecting point D. In this manner, even with the transducers having the pair number, $N < 1.5/k^2$, a filter device having a characteristic which attenuates drastically and rises abruptly in the stop band can be made by connecting the inductance.

Transducers having a pair number of $N > 1.5/k^2$ are sometimes used with a piezoelectric plate of a large electro-mechanical constant $k^2$ or for a filter device of a relatively narrow band. In this case, the transducers are subjected to repetitions of a pair of image impedance connections and their impedances are greatly affected by a dynamic reactance due to vibration and become inductive, so that the same effect as attained by connecting the inductance can be achieved by connecting a capacitance (capacitor). In the foregoing description, $N \simeq 1.5/k^2$ is critical and the cases under $N > 1.5/k^2$ and $N < 1.5/k^2$ are discussed. This condition is applicable to the ordinary transducers each having an electrode finger width and an inter-electrode finger spacing which are ¼ wavelength of the center frequency. For transducers each having an electrode finger width which is different from ¼ wavelength, the above condition shifts slightly.

Figure 4:
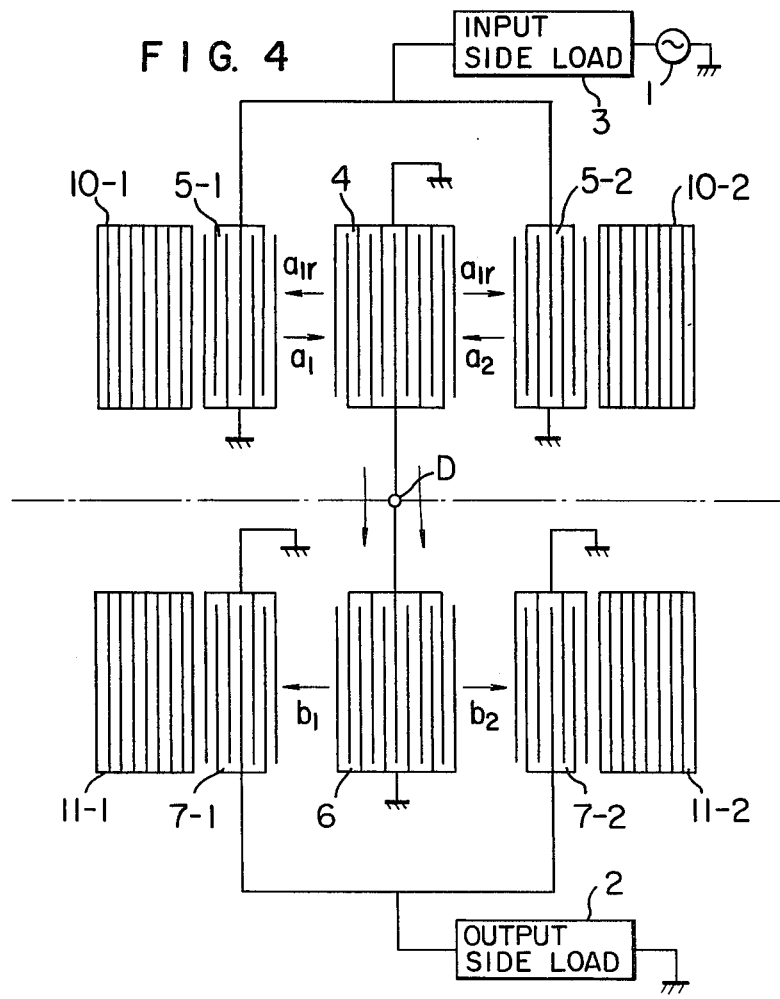
FIG. 4 illustrates another embodiment of the invention.

FIG. 4 shows another embodiment of a band pass filter device according to the present invention. In FIG. 4, what is different from the FIG. 1 filter device is that reflectors 10-1, 10-2, 11-1 and 11-2 substitute for the multi-strip couplers in FIG. 1. The reflectors 10-1 and 10-2 are symmetrical with a first acousto-electric transducer 4 and are disposed outside the transducer 4. The reflectors 11-1 and 11-2 are also symmetrical with a second electro-acoustic transducer 6 and are disposed outside the transducer 6. The former reflectors effectively return acoustic waves departing from the transducer 4 to the transducer 4 and the latter reflectors are effective to cause acoustic waves issuing from the transducer 6 to enter acoustic-electrical transducers 7-1 and 7-2. The first electro-acoustic transducers are thus made unidirectional. As well known in the art, each of the reflectors comprises parallel metal stripes or grooves arranged at a period which is ½ wavelength of the reflecting wave and connected electrically at opposite ends. The filter device of this embodiment is easy to manufacture as compared to the FIG. 1 filter device using the multi-strip couplers. More particularly, when manufacturing a filter device adapted for a frequency of 100 MHz or more in the pass band, a multi-strip coupler used therefor needs thin metal stripes spaced apart at a very small distance and the technique of metal evaporation is not so precise as to eliminate manufacturing of defective multi-strip couplers. The reflector, however, is relatively free from manufacturing difficulties. Elements in FIG. 4 designated by the same reference numerals as those of FIG. 1 have the same construction and operation and will not be detailed herein.

Figure 5:
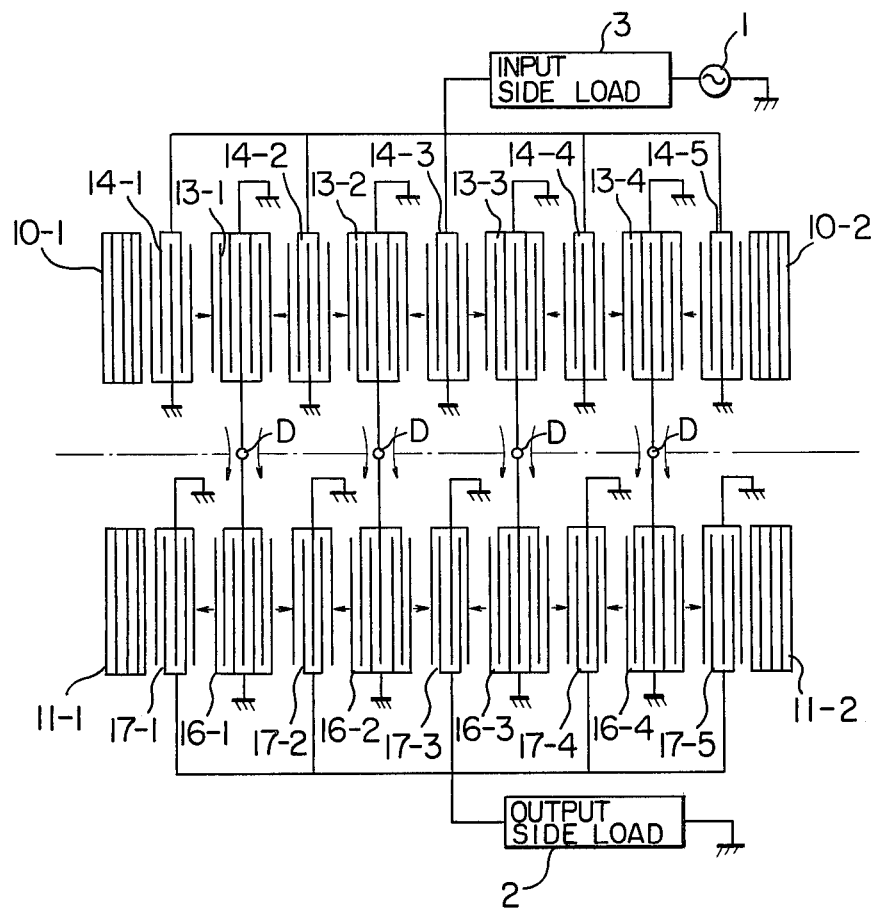
FIG. 5 illustrates a further embodiment of the invention.

FIG. 5 illustrates a further embodiment of a band pass filter device of the present invention. In this embodiment, the first acousto-electric transducer 4 and second electro-acoustic transducer 6 of the FIG. 1 embodiment are in an image impedance connection and are respectively divided into a plurality of transducers 13-1 to 13-4 and a plurality of transducers 16-1 to 16-4. The plurality of transducers are arranged in a propagation direction of acoustic waves. The transducers 13-1 to 13-4 are respectively coupled with the transducers 16-1 to 16-4 in image impedance connection. Similarly, the first electro-acoustic transducer and second acousto-electric transducer of the FIG. 1 embodiment are respectively divided into a plurality of transducers 14-1 to 14-5 and a plurality of transducers 17-1 to 17-5. The transducers 14-1 to 14-5 are associated with the transducers 13-1 to 13-4 on opposite sides thereof. Similarly, the transducers 17-1 to 17-5 are associated with the transducers 16-1 to 16-4 on opposite sides thereof. As in the FIG. 4 embodiment, reflectors 10-1 and 10-2 are respectively associated with the outermost transducers 14-1 and 14-5 on the outsides thereof and reflectors 11-1 and 11-2 are respectively associated with the outermost transducers 17-1 and 17-5. This embodiment is particularly effective to reduce loss at higher frequencies. More particularly, as an aluminum electrode is made in the form of a thin film its resistance loss increases at higher frequencies and loss of the filter device also increases up to several dB. In principle, the affect of the increased resistance loss may be reduced by sufficiently increasing the input-/output impedance of the filter device beyond aluminum resistance. However, ordinary high frequency filters are required to have an input/output impedance of 50Ω.

Since, in the embodiment of FIG. 5, the electro-acoustic transducers 14-1 to 14-5 are electrically connected in parallel, each of the transducers has a very high impedance and is immune to the affect of the increased high frequency resistance of an aluminum thin film. This holds true for the electro-acoustic transducers 17-1 to 17-5.

The arrangement of FIG. 5 is disadvantageous in that its pattern size is slightly larger than that of the FIG. 1 or FIG. 4 device. But the high frequency filter device per se can be decreased in size and the slightly large-sized pattern is not a serious limitation to use. Thus, the FIG. 5 arrangement is advantageously adapted for high frequencies.

Figure 6:
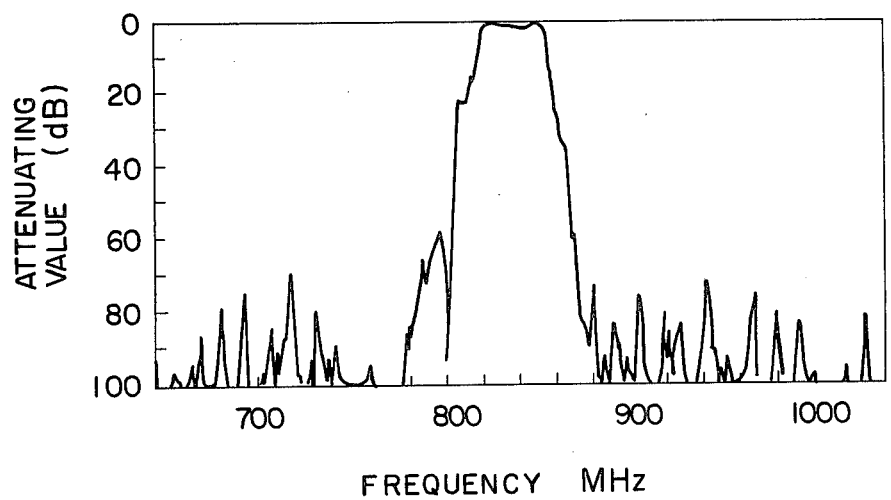
FIG. 6 is a graph showing a frequency characteristic of the band pass filter device according to the FIG. 5 embodiment.

When implementing the FIG. 5 embodiment with the following constants and dimensions, a band pass filter device having a frequency characteristic as shown in FIG. 6 can be obtained.

The constants and dimensions are:

| | |
|---|---|
| center frequency | 830 MHz |
| band-width ratio | 3.5% |
| material of piezoelectric plate | LiTaO$_3$ of 36° rotation, Y cut and X propagation |
| size | 1.5 mm × 1.3 mm |
| material of stripe | aluminum |
| construction of input/output transducer: | |
| number of stripes | 10 pairs × 6 |
| | 4 pairs × 4 |
| distance | 5.2 μm (periodically) |
| construction of transducers in repetitions of a pair of image impedance connections: | |
| number of stripes | 26 pairs × 8 |
| distance | 5.4 μm (periodically) |
| apodizing function | Hamming function |
| construction of reflector: | |
| number of stripes | 20 × 4 |
| distance | 2.6 μm (periodically) |

As will be seen from FIG. 6, this filter device realizes a characteristic wherein the attenuation is 60 dB or more in the stop band and loss and ripple are minimized in the pass band.

It should be understood that the invention is not limited to the embodiments described herein. For example, the transducer may be of an apodized type in which the length of thin metal stripes is varied for apodization to thereby provide the transducer with a characteristic specified to a particular frequency, or the outermost transducer may be made unidirectional by the use of an element other than the multi-strip coupler or reflector.

I claim:

1. A band pass filter device comprising:
   a first band pass filter including a first acousto-electric transducer and first electro-acoustic transducers disposed on opposite sides of the first acousto-electric transducer and adapted for connection in common to an input signal source, said first acousto-electric transducer having pairs of fingers;
   a second band pass filter including a second electro-acoustic transducer connected electrically to said first acousto-electric transducer and second acousto-electric transducers disposed on opposite sides of the second electro-acoustic transducer and connected in common to an output terminal, said second electro-acoustic transducer having pairs of fingers, and
   said first acousto-electric transducer having the same structure as that of said second electro-acoustic transducer in which the number N of pairs of fingers in each of said first acousto-electric transducer and said second electro-acoustic transducer substantially is equal to 1.5/k$^2$, where k$^2$ represents the electromechanical coupling constant of a piezoelectric plate on which said fingers are formed and is expressed by k$^2$=2($v_f-v_m$)$v_f$, $v_f$ representing the velocity of a surface acoustic wave propagating along a free surface of said plate and $v_m$ representing the velocity of a surface acoustic wave propagating along a thin metal coated portion of the surface of said plate.

2. A band pass filter device according to claim 1, wherein each of said first and second electro-acoustic transducers and said first and second acousto-electric transducers is constituted by a plurality of transducer elements, the transducer elements of said first electro-acoustic transducers and those of said first acousto-electric transducer being alternately disposed in a direction parallel with the propagating direction of a surface acoustic wave along the surface of said plate, the transducer elements of said second electro-acoustic transducer and those of said second acousto-electric transducers being alternately disposed in a direction parallel with the propagating direction of a surface acoustic wave along the surface of said plate, and each of said transducer elements of said first acousto-electric transducer being in image impedance connection with the corresponding one of said transducer elements of said second electro-acoustic transducer.

3. A band pass filter device according to claim 2, wherein the outermost ones of said transducer elements of said first electro-acoustic transducers are unidirectional transducer elements.

4. A band pass filter device according to claim 2, wherein the outermost ones of said transducer elements of said second acousto-electric transducers are unidirectional transducer elements.

5. A band pass filter device according to claim 2, wherein the outermost ones of said transducer elements of said first electro-acoustic transducers and said second acousto-electric transducers are unidirectional transducer elements.

6. A band pass filter device according to claim 1, wherein said first electro-acoustic transducers are unidirectional transducers.

7. A band pass filter device according to claim 1, wherein said second acousto-electric transducers are unidirectional transducers.

8. A band pass filter device according to claim 1, wherein said first electro-acoustic transducers and said second acousto-electric transducers are unidirectional transducers.

9. A band pass filter device according to claim 6, 7 or 8, wherein each of said unidirectional transducers is constituted by a bidirectional transducer and a multi-strip coupler.

10. A band pass filter device according to claim 3, 4 or 5, wherein each of said unidirectional transducer elements is constituted by a bidirectional transducer element and a multi-strip coupler.

11. A band pass filter device according to claim 6, 7 or 8, wherein each of said unidirectional transducers is constituted by a bidirectional transducer and a reflector.

12. A band pass filter device according to claim 3, 4 or 5, wherein each of said unidirectional transducer elements is constituted by a bidirectional transducer element and a reflector.

* * * * *